US007253699B2

(12) United States Patent
Schaffner et al.

(10) Patent No.: US 7,253,699 B2
(45) Date of Patent: Aug. 7, 2007

(54) RF MEMS SWITCH WITH INTEGRATED IMPEDANCE MATCHING STRUCTURE

(75) Inventors: James H. Schaffner, Chatsworth, CA (US); William B. Bridges, Sierra Madre, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 10/786,736

(22) Filed: Feb. 24, 2004

(65) Prior Publication Data

US 2004/0227583 A1 Nov. 18, 2004

Related U.S. Application Data

(60) Provisional application No. 60/470,026, filed on May 12, 2003.

(51) Int. Cl.
*H03H 7/38* (2006.01)

(52) U.S. Cl. .......................... 333/32; 333/262; 333/33; 333/34

(58) Field of Classification Search ................ 333/262, 333/32, 33, 34
See application file for complete search history.

(56) References Cited

U.S. PATENT DOCUMENTS

| | | | |
|---|---|---|---|
| 3,267,480 A | 8/1966 | Lerner | 343/911 |
| 3,560,978 A | 2/1971 | Himmel et al. | 343/106 |
| 3,810,183 A | 5/1974 | Krutsinger et al. | 343/708 |
| 3,961,333 A | 6/1976 | Purinton | 343/872 |
| 4,045,800 A | 8/1977 | Tang et al. | 343/854 |
| 4,051,477 A | 9/1977 | Murphy et al. | 343/700 MS |
| 4,119,972 A | 10/1978 | Fletcher et al. | 343/844 |
| 4,123,759 A | 10/1978 | Hines et al. | 343/854 |
| 4,124,852 A | 11/1978 | Steudel | 343/854 |
| 4,127,586 A | 11/1978 | Rody et al. | 260/308 B |
| 4,150,382 A | 4/1979 | King | 343/754 |
| 4,173,759 A | 11/1979 | Bakhru | 343/100 |
| 4,189,733 A | 2/1980 | Malm | 343/100 SA |
| 4,217,587 A | 8/1980 | Jacomini | 343/100 SA |
| 4,220,954 A | 9/1980 | Marchland | 343/113 R |
| 4,236,158 A | 11/1980 | Daniel | 343/100 LE |
| 4,242,685 A | 12/1980 | Sanford | 343/770 |
| 4,266,203 A | 5/1981 | Saudreau et al. | 333/21 A |
| 4,308,541 A | 12/1981 | Seidel et al. | 343/786 |
| 4,367,475 A | 1/1983 | Schiavone | 343/767 |

(Continued)

FOREIGN PATENT DOCUMENTS

DE 196 00 609 A1 4/1997

(Continued)

OTHER PUBLICATIONS

U.S. Appl. No. 10/792,411, filed Mar. 2, 2004, Sievenpiper.

(Continued)

*Primary Examiner*—Robert Pascal
*Assistant Examiner*—Kimberly E Glenn
(74) *Attorney, Agent, or Firm*—Ladas & Parry

(57) ABSTRACT

An impedance matching structure for a RF MEMS switch having at least one closeable RF contact in an RF line, the impedance matching structure comprising a protuberance in the RF line immediately adjacent the RF contact that forms one element of a capacitor, the other element of which is formed by the switch's ground plane.

24 Claims, 6 Drawing Sheets

U.S. PATENT DOCUMENTS

| | | | | |
|---|---|---|---|---|
| 4,370,659 | A | 1/1983 | Chu et al. | 343/772 |
| 4,387,377 | A | 6/1983 | Kandler | 343/756 |
| 4,395,713 | A | 7/1983 | Nelson et al. | 343/713 |
| 4,443,802 | A | 4/1984 | Mayes | 343/729 |
| 4,590,478 | A | 5/1986 | Powers et al. | 343/700 MS |
| 4,594,595 | A | 6/1986 | Struckman | 343/770 |
| 4,672,386 | A | 6/1987 | Wood | 343/770 |
| 4,684,953 | A | 8/1987 | Hall | 343/725 |
| 4,700,197 | A | 10/1987 | Milne | 343/837 |
| 4,737,795 | A | 4/1988 | Nagy et al. | 343/712 |
| 4,749,996 | A | 6/1988 | Tresselt | 343/700 MS |
| 4,760,402 | A | 7/1988 | Mizuno et al. | 343/713 |
| 4,782,346 | A | 11/1988 | Sharma | 343/795 |
| 4,803,494 | A | 2/1989 | Norris et al. | 343/770 |
| 4,821,040 | A | 4/1989 | Johnson et al. | 343/700 MS |
| 4,835,541 | A | 5/1989 | Johnson et al. | 343/713 |
| 4,843,400 | A | 6/1989 | Tsao et al. | 343/700 MS |
| 4,843,403 | A | 6/1989 | Lalezari et al. | 343/767 |
| 4,853,704 | A | 8/1989 | Diaz et al. | 343/767 |
| 4,903,033 | A | 2/1990 | Tsao et al. | 343/700 MS |
| 4,905,014 | A | 2/1990 | Gonzalez et al. | 343/909 |
| 4,916,457 | A | 4/1990 | Foy et al. | 343/770 |
| 4,922,263 | A | 5/1990 | Dubost et al. | 343/797 |
| 4,958,165 | A | 9/1990 | Axford et al. | 343/770 |
| 4,975,712 | A | 12/1990 | Chen | 343/754 |
| 5,021,795 | A | 6/1991 | Masiulis | 343/700 MS |
| 5,023,623 | A | 6/1991 | Kreinheder et al. | 343/725 |
| 5,070,340 | A | 12/1991 | Diaz | 343/767 |
| 5,081,466 | A | 1/1992 | Bitter, Jr. | 343/767 |
| 5,115,217 | A | 5/1992 | McGrath et al. | 333/246 |
| 5,121,089 | A * | 6/1992 | Larson | 333/107 |
| 5,146,235 | A | 9/1992 | Frese | 343/895 |
| 5,158,611 | A | 10/1992 | Ura et al. | 106/499 |
| 5,208,603 | A | 5/1993 | Yee | 343/909 |
| 5,218,374 | A | 6/1993 | Koert et al. | 343/789 |
| 5,235,343 | A | 8/1993 | Audren et al. | 343/816 |
| 5,268,696 | A | 12/1993 | Buck et al. | 342/372 |
| 5,268,701 | A | 12/1993 | Smith | 343/767 |
| 5,278,562 | A | 1/1994 | Martin et al. | 342/1 |
| 5,287,116 | A | 2/1994 | Iwasaki et al. | 343/700 MS |
| 5,287,118 | A | 2/1994 | Budd | 343/909 |
| 5,402,134 | A | 3/1995 | Miller et al. | 343/742 |
| 5,406,292 | A | 4/1995 | Schnetzer et al. | 343/700 MS |
| 5,519,408 | A | 5/1996 | Schnetzer | 343/767 |
| 5,525,954 | A | 6/1996 | Komazaki et al. | 333/219 |
| 5,531,018 | A | 7/1996 | Saia et al. | 29/622 |
| 5,532,709 | A | 7/1996 | Talty | 343/819 |
| 5,534,877 | A | 7/1996 | Sorbello et al. | 343/700 MS |
| 5,541,614 | A | 7/1996 | Lam et al. | 343/792.5 |
| 5,557,291 | A | 9/1996 | Chu et al. | 343/725 |
| 5,581,266 | A | 12/1996 | Peng et al. | 343/770 |
| 5,589,845 | A | 12/1996 | Yandrofski et al. | 343/909 |
| 5,598,172 | A | 1/1997 | Chekroun | 343/754 |
| 5,611,940 | A | 3/1997 | Zettler | 73/514.16 |
| 5,619,365 | A | 4/1997 | Rhoads et al. | 359/248 |
| 5,619,366 | A | 4/1997 | Rhoads et al. | 359/248 |
| 5,621,571 | A | 4/1997 | Bantli et al. | 359/529 |
| 5,638,946 | A | 6/1997 | Zavracky | 200/181 |
| 5,644,319 | A | 7/1997 | Chen et al. | 343/702 |
| 5,694,134 | A | 12/1997 | Barnes | 343/700 |
| 5,721,194 | A | 2/1998 | Yandrofski et al. | 505/210 |
| 5,767,807 | A | 6/1998 | Pritchett | 342/374 |
| 5,808,527 | A | 9/1998 | De Los Santos | 333/205 |
| 5,815,818 | A | 9/1998 | Tanaka et al. | 455/522 |
| 5,874,915 | A | 2/1999 | Lee et al. | 342/375 |
| 5,892,485 | A | 4/1999 | Glabe et al. | 343/789 |
| 5,894,288 | A | 4/1999 | Lee et al. | 343/770 |
| 5,905,465 | A | 5/1999 | Olson et al. | 343/700 MS |
| 5,923,303 | A | 7/1999 | Schwengler et al. | 343/853 |
| 5,926,139 | A | 7/1999 | Korisch | 343/702 |
| 5,929,819 | A | 7/1999 | Grinberg | 343/754 |
| 5,943,016 | A | 8/1999 | Snyder, Jr. et al. | 343/700 MS |
| 5,945,951 | A | 8/1999 | Monte et al. | 343/700 MS |
| 5,949,382 | A | 9/1999 | Quan | 343/767 |
| 5,966,096 | A | 10/1999 | Brachat | 343/700 MS |
| 5,966,101 | A | 10/1999 | Haub et al. | 343/767 |
| 6,005,519 | A | 12/1999 | Burns | 343/700 MS |
| 6,005,521 | A | 12/1999 | Suguro et al. | 343/700 MS |
| 6,008,770 | A | 12/1999 | Sugawara | 343/767 |
| 6,016,125 | A | 1/2000 | Johansson | 343/702 |
| 6,028,561 | A | 2/2000 | Takei | 343/767 |
| 6,028,692 | A | 2/2000 | Rhoads et al. | 359/245 |
| 6,034,644 | A | 3/2000 | Okabe et al. | 343/767 |
| 6,034,655 | A | 3/2000 | You | 345/60 |
| 6,037,905 | A | 3/2000 | Koscica et al. | 343/701 |
| 6,040,803 | A | 3/2000 | Spall | 343/700 MS |
| 6,046,655 | A | 4/2000 | Cipolla | 333/137 |
| 6,046,659 | A | 4/2000 | Loo et al. | 333/362 |
| 6,054,659 | A | 4/2000 | Lee et al. | 200/181 |
| 6,061,025 | A | 5/2000 | Jackson et al. | 343/700 MS |
| 6,075,485 | A | 6/2000 | Lilly et al. | 343/700 MS |
| 6,081,235 | A | 6/2000 | Romanofsky et al. | 343/700 MS |
| 6,081,239 | A | 6/2000 | Sabet et al. | 343/753 |
| 6,097,263 | A | 8/2000 | Mueller et al. | 333/17.1 |
| 6,097,343 | A | 8/2000 | Goetz et al. | 343/708 |
| 6,118,406 | A | 9/2000 | Josypenko | 343/700 MS |
| 6,118,410 | A | 9/2000 | Nagy | 343/713 |
| 6,127,908 | A | 10/2000 | Bozler et al. | 333/246 |
| 6,150,989 | A | 11/2000 | Aubry | 343/767 |
| 6,154,176 | A | 11/2000 | Fathy et al. | 343/700 MS |
| 6,166,705 | A | 12/2000 | Mast et al. | 343/853 |
| 6,175,337 | B1 | 1/2001 | Jasper, Jr. et al. | 343/770 |
| 6,175,723 | B1 | 1/2001 | Rothwell, III | 455/63 |
| 6,188,369 | B1 | 2/2001 | Okabe et al. | 343/767 |
| 6,191,724 | B1 | 2/2001 | McEwan | 342/21 |
| 6,198,438 | B1 | 3/2001 | Herd et al. | 343/700 MS |
| 6,198,441 | B1 | 3/2001 | Okabe et al. | 343/702 |
| 6,204,819 | B1 | 3/2001 | Hayes et al. | 343/702 |
| 6,218,912 | B1 | 4/2001 | Mayer | 333/106 |
| 6,218,997 | B1 | 4/2001 | Lindenmeier et al. | 343/725 |
| 6,246,377 | B1 | 6/2001 | Aiello et al. | 343/700 |
| 6,252,473 | B1 | 6/2001 | Ando | 333/105 |
| 6,285,325 | B1 | 9/2001 | Nalbandian et al. | 343/700 MS |
| 6,307,519 | B1 | 10/2001 | Livingston et al. | 343/767 |
| 6,317,095 | B1 | 11/2001 | Teshirogi et al. | 343/785 |
| 6,323,826 | B1 | 11/2001 | Sievenpiper et al. | 343/909 |
| 6,331,257 | B1 | 12/2001 | Loo et al. | 216/13 |
| 6,337,668 | B1 | 1/2002 | Ito et al. | 343/833 |
| 6,366,254 | B1 | 4/2002 | Sievenpiper et al. | 343/700 |
| 6,373,349 | B2 | 4/2002 | Gilbert | 333/126 |
| 6,380,895 | B1 | 4/2002 | Moren et al. | 343/700 MS |
| 6,388,631 | B1 | 5/2002 | Livingston et al. | 343/767 |
| 6,392,610 | B1 | 5/2002 | Braun et al. | 343/876 |
| 6,404,390 | B2 | 6/2002 | Sheen | 343/700 MS |
| 6,404,401 | B2 | 6/2002 | Gilbert et al. | 343/780 |
| 6,407,719 | B1 | 6/2002 | Ohira et al. | 343/893 |
| 6,417,807 | B1 | 7/2002 | Hsu et al. | 343/700 MS |
| 6,424,319 | B2 | 7/2002 | Ebling et al. | 343/911 L |
| 6,426,722 | B1 | 7/2002 | Sievenpiper et al. | 343/700 MS |
| 6,440,767 | B1 | 8/2002 | Loo et al. | 438/52 |
| 6,469,673 | B2 | 10/2002 | Kaiponen | 343/703 |
| 6,473,362 | B1 | 10/2002 | Gabbay | 367/119 |
| 6,483,480 | B1 | 11/2002 | Sievenpiper et al. | 343/909 |
| 6,496,155 | B1 | 12/2002 | Sievenpiper et al. | 343/770 |
| 6,515,635 | B2 | 2/2003 | Chiang et al. | 343/834 |
| 6,518,931 | B1 | 2/2003 | Sievenpiper | 343/700 |
| 6,525,695 | B2 | 2/2003 | McKinzie, III | 343/756 |
| 6,538,621 | B1 | 3/2003 | Sievenpiper et al. | 343/909 |
| 6,552,696 | B1 | 4/2003 | Sievenpiper et al. | 343/909 |
| 6,624,720 | B1 | 9/2003 | Allison et al. | 333/105 |
| 6,642,889 | B1 | 11/2003 | McGrath | 343/700 MS |
| 6,657,525 | B1 * | 12/2003 | Dickens et al. | 335/78 |
| 6,741,207 | B1 | 5/2004 | Allison et al. | 342/371 |

| | | | | |
|---|---|---|---|---|
| 6,822,622 | B2 | 11/2004 | Crawford et al. | 343/909 |
| 6,897,810 | B2 | 5/2005 | Dai et al. | 343/700 MS |
| 6,897,831 | B2 | 5/2005 | McKinzie et al. | 343/909 |
| 6,917,343 | B2 | 7/2005 | Sanchez et al. | 343/795 |
| 2001/0035801 | A1 | 11/2001 | Gilbert | 333/126 |
| 2002/0036586 | A1 | 3/2002 | Gothard et al. | 342/374 |
| 2003/0122721 | A1 | 7/2003 | Sievenpiper | 343/767 |
| 2003/0193446 | A1 | 10/2003 | Chen | 343/893 |
| 2003/0222738 | A1 | 12/2003 | Brown et al. | 333/206 |
| 2003/0227351 | A1 | 12/2003 | Sievenpiper | 333/105 |
| 2004/0113713 | A1 | 6/2004 | Zipper et al. | 333/206 |
| 2004/0135649 | A1 | 7/2004 | Sievenpiper | 333/105 |
| 2004/0227667 | A1 | 11/2004 | Sievenpiper | 343/700 MS |
| 2004/0227668 | A1 | 11/2004 | Sievenpiper | 343/700 MS |
| 2004/0227678 | A1 | 11/2004 | Sievenpiper | 343/702 |
| 2004/0263408 | A1 | 12/2004 | Sievenpiper et al. | 343/757 |
| 2005/0012667 | A1 | 1/2005 | Noujeim | 343/700 MS |

FOREIGN PATENT DOCUMENTS

| | | | |
|---|---|---|---|
| EP | 0 539 297 | | 4/1993 |
| EP | 1 158 605 | A1 | 11/2001 |
| FR | 2 785 476 | | 5/2000 |
| GB | 1145208 | | 3/1969 |
| GB | 2 281 662 | | 3/1995 |
| GB | 2 328 748 | | 3/1999 |
| JP | 61-260702 | | 11/1986 |
| WO | 94/00891 | | 1/1994 |
| WO | 96/29621 | | 9/1996 |
| WO | 98/21734 | | 5/1998 |
| WO | 99/50929 | | 10/1999 |
| WO | 00/44012 | | 7/2000 |
| WO | 01/31737 | | 5/2001 |
| WO | 01/73891 | A1 | 10/2001 |
| WO | 01/73893 | A1 | 10/2001 |
| WO | 03/098732 | A1 | 11/2003 |

OTHER PUBLICATIONS

U.S. Appl. No. 10/792,412, filed Mar. 2, 2004, Sievenpiper.

U.S. Appl. No. 10/836,966, filed Apr. 30, 2004, Sievenpiper.

U.S. Appl. No. 10/844,104, filed May 11, 2004, Sievenpiper.

Balanis, C., "Aperture Antennas," *Antenna Theory, Analysis and Design*, 2nd Edition, Ch. 12, pp. 575-597 (1997).

Balanis, C., "Microstrip Antennas," *Antenna Theory, Analysis and Design*, 2nd Edition , Ch. 14, pp. 722-736 (1997).

Bialkowski, M.E., et al., "Electronically Steered Antenna System for the Australian Mobilesat," *IEE Proc.-Microw. Antennas Propag.*, vol. 143, No. 4, pp. 347-352 (Aug. 1996).

Bradley, T.W., et al., "Development Of A Voltage-Variable Dielectric (VVD) , Electronic Scan Antenna," *Radar 97*, Publication No. 449, pp. 383-385 (Oct. 1997).

Chen, P.W., et al., Planar Double-Layer Leaky Wave Microstrip Antenna, *IEEE Transactions on Antennas and Propagation*, vol. 50, pp. 832-835 (2002).

Chen, Q., et al., "FDTD diakoptic design of a slop-loop antenna excited by a coplanar waveguide," *Proceedings of the 25th European Microwave Conference 1995*, vol. 2, Conf. 25, pp. 815-819 (Sep. 4, 1995).

Cognard, J., "Alignment of Nematic Liquid Crystals and Their Mixtures," *Mol. Cryst. Liq., Cryst. Suppl. 1*, pp. 1-74 (1982).

Doane, J.W., et al., "Field Controlled Light Scattering from Nematic Microdroplets," *Appl. Phys. Lett.*, vol. 48, pp. 269-271 (Jan. 1986).

Ellis, T.J., et al., "MM-Wave Tapered Slot Antennas on Micromachined Photonic Bandgap Dielectrics," *1996 IEEE MTT-S International Microwave Symposium Digest*, vol. 2, pp. 1157-1160 (1996).

Grbic, A., et al., "Experimental Verification of Backward Wave Radiation From A Negative Refractive Index Metamaterial," *Journal of Applied Physics*, vol. 92, No. 10, pp. 5930-5935 (Nov. 15, 2002).

Hu, C.N., et al., "Analysis and Design of Large Leaky-Mode Array Employing The Coupled-Mode Approach," *IEEE Transactions on Microwave Theory and Techniques*, vol. 49, No. 4, pp. 629-636 (Apr. 2001).

Jablonski, W., et al., "Microwave Schottky Diode With Beam-Lead Contacts," *13th Conference on Microwaves, Radar and Wireless Communications*, MIKON-2000, vol. 2, pp. 678-681 (2000).

Jensen, M.A., et al., "EM Interaction of Handset Antennas and a Human in Personal Communications," *Proceedings of the IEEE*, vol. 83, No. 1, pp. 7-17 (Jan. 1995).

Jensen, M.A., et al., "Performance Analysis of Antennas for Handheld Transceivers Using FDTD," *IEEE Transactions on Antennas and Propagation*, vol. 42, No. 8, pp. 1106-1113 (Aug. 1994).

Lee, J.W., et al., "TM-Wave Reduction From Grooves In A Dielectric-Covered Ground Plane," *IEEE Transactions on Antennas and Propagation*, vol. 49, No. 1, pp. 104-105 (Jan. 2001).

Linardou, I., et al., "Twin Vivaldi Antenna Fed By Coplanar Waveguide, " *Electronics Letters*, vol. 33, No. 22, pp. 1835-1837 (1997).

Malherbe, A., et al., "The Compensation of Step Discontinues in TEM-Mode Transmission Lines," *IEEE Transactions on Microwave Theory and Techniques*, vol. MTT-26, No. 11, pp. 883-885 (Nov. 1978).

Maruhashi, K., et al., "Design and Performance of a *Ka* -Band Monolithic Phase Shifter Utilizing Nonresonant FET Switches," *IEEE Transactions on Microwave Theory and Techniques*, vol. 48, No. 8, pp. 1313-1317 (Aug. 2000).

Perini, P., et al., "Angle and Space Diversity Comparisons in Different Mobile Radio Environments," *IEEE Transactions on Antennas and Propagation*, vol. 46, No. 6, pp. 764-775 (Jun. 1998).

Ramo, S., et al., *Fields and Waves in Communication Electronics*, 3rd Edition, Sections 9.8-9.11, pp. 476-487 (1994).

Rebeiz, G.M., et al., "RF MEMS Switches and Switch Circuits," *IEEE Microwave Magazine*, pp. 59-71 (Dec. 2001).

Schaffner, J., et al., "Reconfigurable Aperture Antennas Using RF MEMS Switches for Multi-Octave Tunability and Beam Steering," *IEEE Antennas and Propagation Society International Symposium, 2000 Digest*, vol. 1 of 4, pp. 321-324 (Jul. 16, 2000).

Semouchkina, E., et al., "Numerical Modeling and Experimental Study of A Novel Leaky Wave Antenna," *Antennas and Propagation Society*, IEEE International Symposium, vol. 4, pp. 234-237 (2001).

Sievenpiper, D., et al., "Eliminating Surface Currents With Metallodielectric Photonic Crystals," *1998 MTT-S International Microwave Symposium Digest*, vol. 2, pp. 663-666 (Jun. 7, 1998).

Sievenpiper, D., et al., "High-Impedance Electromagnetic Surfaces with a Forbidden Frequency Band," *IEEE Transactions on Microwave Theory and Techniques*, vol. 47, No. 11, pp. 2059-2074 (Nov. 1999).

Sievenpiper, D., et al., "High-Impedance Electromagnetic Surfaces," *Ph.D. Dissertation*, Dept. Of Electrical Engineering, University of California, Los Angeles CA, pp. i-xi, 1-150 (1999).

Sievenpiper, D., et al., "Low-Profile, Four-Sector Diversity Antenna On High-Impedance Ground Plane," *Electronics Letters*, vol. 36, No. 16, pp. 1343-1345 (Aug. 3, 2000).

Sor, J., et al., "A Reconfigurable Leaky-Wave/Patch Microstrip Aperture For Phased-Array Applications," *IEEE Transactions on Microwave Theory and Techniques*, vol. 50, No. 8, pp. 1877-1884 (Aug. 2002).

Vaughan, Mark J., et al., "InP-Based 28 $Gh_z$ Integrated Antennas for Point-to-Multipoint Distribution," *Proceedings of the IEEE/Cornell Conference on Advanced Concepts in High Speed Semiconductor Devices and Circuits*, pp. 75-84 (1995).

Vaughan, R., "Spaced Directive Antennas for Mobile Communications by the Fourier Transform Method," *IEEE Transactions on Antennas and Propagation*, vol. 48, No. 7, pp. 1025-1032 (Jul. 2000).

Wang, C.J., et al., "Two-Dimensional Scanning Leaky Wave Antenna by Utilizing the Phased Array," *IEEE Microwave and Wireless Components Letters*, vol. 12, No. 8, pp. 311-313, (Aug. 2002).

Wu, S.T., et al., "High Birefringence and Wide Nematic Range Bis-Tolane Liquid Crystals," *Appl. Phys. Lett.*, vol. 74, No. 5, pp. 344-346 (Jan. 18, 1999).
Yang, Hung-Yu David, et al., "Theory of Line-Source Radiation From A Metal-Strip Grating Dielectric-Slab Structure," *IEEE Transactions on Antennas and Propagation*, vol. 48, No. 4, pp. 556-564 (2000).
Yashchyshyn, Y., et al., The Leaky-Wave Antenna With Ferroelectric Substrate, *14th International Conference on Microwaves, Radar Wireless Communications*, MIKON-2002, vol. 2, pp. 218-221 (2002).
U.S. Appl. No. 10/944,032, filed Sep. 17, 2004, Sievenpiper.
Brown, W.C., "The History of Power Transmission by Radio Waves," *IEEE Transactions on Microwave Theory and Techniques*, vol. MTT-32, No. 9, pp. 1230-1242 (Sep. 1984).
Fay, P., et al., "High-Performance Antimonide-Based Heterostructure Backward Diodes for Millimeter-Wave Detection," *IEEE Electron Device Letters*, vol. 23, No. 10, pp. 585-587 (Oct. 2002).
Gold, S.H.,et al., "Review of High-Power Microwave Source Research," *Rev. Sci. Instrum.*, vol. 68, No. 11, pp. 3945-3974 (Nov. 1997).
Koert, P., et al., "Millimeter Wave Technology for Space Power Beaming," *IEEE Transactions on Microwave Theory and Techniques*, vol. 40, No. 6, pp. 1251-1258 (Jun. 1992).
Lezec, H.J., et al., "Beaming Light from a Subwavelength Aperture," *Science*, vol. 297, pp. 820-821 (Aug. 2, 2002).
McSpadden, J.O.,et al., "Design and Experiments of a High-Conversion-Efficiency 5.8-GHz Rectenna," *IEEE Transactions on Microwave Theory and Techniques*, vol. 46, No. 12, pp. 2053-2060 (Dec. 1998).
Schulman, J.N., et al., "Sb-Heterostructure Interband Backward Diodes," *IEEE Electron Device Letters*, vol. 21, No. 7, pp. 353-355 (Jul. 2000).
Sievenpiper, D., et al., "Beam Steering Microwave Reflector Based On Electrically Tunable Impedance Surface," *Electronics Letters*, vol. 38, No. 21, pp. 1237-1238 (Oct. 1, 2002).
Sievenpiper, D.F., et al., "Two-Dimensional Beam Steering Using an Electrically Tunable Impedance Surface," *IEEE Transactions on Antennas and Propagation*, vol. 51, No. 10, pp. 2713-2722 (Oct. 2003).
Strasser, B., et al., "5.8-GHz Circularly Polarized Rectifying Antenna for Wireless Microwave Power Transmission," *IEEE Transactions on Microwave Theory and Techniques*, vol. 50, No. 8, pp. 1870-1876 (Aug. 2002).
Swartz, N., "Ready for CDMA 2000 1xEV-Do?," *Wireless Review*, 2 pages total (Oct. 29, 2001).
Yang, F.R., et al., "A Uniplanar Compact Photonic-Bandgap (UC-PBG) Structure and Its Applications for Microwave Circuits," *IEEE Transactions on Microwave Theory and Techniques*, vol. 47, No. 8, 1509-1514 (Aug. 1999).
Bushbeck, M.D., et al., "A Tunable Switcher Dielectric Grating," *IEEE Microwave and Guided Wave Letters*, vol. 3, No. 9, pp. 296-298 (Sep. 1993).
Chambers, B., et al., "Tunable Radar Absorbers Using Frequency Selective Surfaces," *11th International Conference on Antennas and Propagation*, vol. 50, pp. 832-835 (2002).
Chang, T.K., et al., "Frequency Selective Surfaces on Biased Ferrite Substrates," *Electronics Letters*, vol. 30, No. 15, pp. 1193-1194 (Jul. 21, 1994).
Gianvittorio, J.P., et al., "Reconfigurable MEMS-enabled Frequency Selective Surfaces," *Electronic Letters*, vol. 38, No. 25, pp. 1627-1628 (Dec. 5, 2002).
Lima, A.C., et al., "Tunable Frequency Selective Surfaces Using Liquid Substrates," *Electronic Letters*, vol. 30, No. 4, pp. 281-282 (Feb. 17, 1994).
Oak, A.C., et al. "A Varactor Tuned 16 Element MESFET Grid Oscillator," *Antennas and Propagation Society International Symposium*. pp. 1296-1299 (1995).

* cited by examiner

RF MEMS SWITCH WITH INTEGRATED IMPEDANCE MATCHING STRUCTURE

CROSS REFERENCE TO RELATED APPLICATION

This application claims the benefit of U.S. Provisional Patent Application No. 60/470,026 filed May 12, 2003, the disclosure of which is hereby incorporated herein by reference.

TECHNICAL FIELD

The presently disclosed technology relates to RF Micro-Electro-Mechanical System (MEMS) switches and, more particularly, to RF MEMS switches with integrated impedance matching structures.

BACKGROUND INFORMATION

Return loss is a measure of the amount of energy reflected back toward the RF source by a device. A high return loss (in dB) means that most of the signal energy gets into the device, or for a switch, most of the energy gets through the switch, if the switch itself has very little insertion loss. This is important for RF receiver front-ends where any loss, including loss of energy by reflections, directly impacts the gain and noise figure of the system.

The current HRL Laboratories' double-contact RF MEMS shown in FIG. 1 has a return loss that is less than 15 dB at 40 GHz when the switch is closed. This is too low for many switch networks where a return loss of greater than 20 dB is desired. An embodiment of the RF MEMS switch described herein is an improved double-contact RF MEMS that can achieve a return loss better than 30 dB with 3 dB or less degradation of isolation. This is an improvement of at least 15 dB in return loss over the current HRL Laboratories' practice.

Having a high return loss is important in any electrical system. HRL Laboratories' RF MEMS switch designs have been considered for use in a number of applications, including low-loss phase-shifters, system redundancy, millimeter wave beam switching, and tunable filters and oscillators. Improving the return loss, by increasing it, is desirable.

The prior art includes:

1. Loo, et. al., "Fabrication of Broadband Surface Micro-machined Micro-electro-mechanical Switches for Microwave and Millimeter Wave Applications," U.S. Pat. No. 6,331,257 of Dec. 18, 2001. This patent identifies the equivalent circuit of HRL Laboratories' switch as inductive in nature and that shunt capacitances could be used tas impedance matching circuits for the switch. FIG. 6 of this patent shows such a matching network using microstrip radial stubs. Microstrip radial stubs are elements well known for impedance matching circuits, but they are not necessary, and perhaps overly complicated, for a monolithic matching circuit.
2. Loo, et. al., "Monolithic Single Pole Double Throw RF MEMS Switch," U.S. Pat. No. 6,440,767 of Aug. 27, 2002. The current practice of HRL Laboratories' RF MEMS double contact switches uses an elongate, moveable metal bar to connect the input and output transmission lines when the switch is closed. This metal bar has a width that is less than the width of the input and output transmission lines. The input and output transmission line width is nominally 50 ohms when the switch is used in a series microstrip configuration. Although some switches in the past have been fabricated with a bar the same width as the input and output transmission lines, the preferred practice is now to fabricate switches with a narrow connecting bar. This is because of fabrication yield and insertion loss reliability when the switch is closed. This type of switch is shown in the figures of that patent.

In order to make the transition from the larger width line to the smaller width line, a short linear taper is used. The metal bar appears as a small inductor at frequencies where its length is much less than a wavelength. When the taper and metal bar are much less than a wavelength, the effect of the inductance is not noticeable and the return loss is very good. As the frequency increases, the inductance of the bar becomes significant, and the return loss degrades.

With respect to this technology, the inventors have taken into account the inductance of the metal bar, and have added integrated compensating capacitors to the electrode itself. These capacitors take the form of a widening or hump in the input and output lines close to the switch connection bar contacts in combination with the switch's ground plane. This results in a vast improvement in the return loss of the switch with the narrow metal connecting bar, especially at millimeter wave frequencies.

Aside from the patents listed above, documents related to other tapered structures related to monolithic circuits and switches are noted below which shows that most switch devices are capacitive in nature, thus requiring inductive matching such as tapered lines. Being inductive, HRL Laboratories' RF MEMS switch is apparently unique in the field of RF switches in that it requires a capacitive-type matching network.

1. Malherbe, A. G. Johannes and Steyn, Andre F., "The Compensation of Step Discontinuites in TEM-Mode Transmission Lines," *IEEE Trans. Microwave Theory Tech*., Vol. MTT-26, No. 11, November 1978, pp. 883-885.—The use of short tapers between transmission line step discontinuities is a standard practice for microwave devices, such as diodes and FET's. In most cases, the input to the device has a parasitic capacitance, so narrowing the input transmission line adds some compensating inductance. Since the active part of the device is very small compared to a wavelength, linear tapers provide an acceptable input to and output from the device. This paper shows how to optimize this transition. This paper is listed to help give a physical basis to the current practice of RF line connection to microwave devices.
2. Jablonski, W., Jung, W., Gorska, M., Wrzesinska, H. and Zebrowski, Z. "Microwave Schottky Diode With Beam-Lead Contacts," 13th International Conference on Microwaves, Radar and Wireless Communications. 2000*, MIKON*-2000, Vol. 2, pp. 678-681, 2000. And Maruhashi, Kenichi, Mizutani, Hiroshi, and Ohata, Keichi, "Design and Performance of a Ka-Band Monolithic Phase Shifter Utilizing Nonresonant FET Switches," *IEEE Trans. Microwave Theory Tech*., Vol. 48, No. 8, August 2000, pp. 1313-1317.—Both of these papers have figures which show a linear taper from microstrip transmission line inputs and outputs into the device active region. These papers are cited as examples of current practice.
3. Rebeiz, Gabriel M. and Muldavin, Jeremy B., 'RF MEMS Switches and Switch Circuits," *IEEE Microwave Magazine*, December 2001, pp. 59-71.—This paper has a figure that shows that even for series RF MEMS, linear tapers are used to connect to the switch region.

CURRENT PRACTICE AND BACKGROUND INFORMATION

FIG. 1 shows a drawing of a RF MEMS switch according to a current practice of HRL Laboratories of Malibu, Calif. The switch is fabricated on a substrate 1 such as semi-insulating GaAs or other high resistivity material. The switch is comprised of a cantilever beam 2 that is fabricated from silicon nitride and gold, as described in U.S. Pat. No. 6,440,767. This cantilever beam is pulled down by an electrostatic force between two actuation electrodes 3. The voltage required for actuation is supplied from an external source through actuation electrode pads 4, and metal lines 5 connecting the pads 4 to the actuation electrodes 3. RF transmission lines 6 are also fabricated on the substrate 1. Lines 6 are not connected together so that when the cantilever beam 2 is in its up position, a gap exists between the RF lines 6 and an RF open circuit exists between the RF input and output. When the cantilever beam 2 is pulled down, an elongate moveable metal member or bar 7, which is part of the cantilever beam, is brought across the RF lines 6, connecting them together, thus connecting the RF input and output. The actual metal contacts to the RF transmission lines 6 are provided by two metal dimples (not shown in this figure) that are fabricated as part of the contact bar 7. The bar 7 preferably provides high contacting pressure for low contact resistance at the metal dimples. A ground plane is provided on the bottom side of the substrate 1.

The width of the metal contacting bar 7 is optimized for fabrication yield as well as low contact resistance. The widths of the RF transmission lines 6 are made to be 50 Ω at the edges of the switch when the bottom of the substrate 1 is grounded (in this case the transmission lines are known as microstrip lines). As shown in FIG. 1, the metal bar 7 is smaller in width than the input and output RF transmission lines 6. Two tapered regions transition the RF lines to the smaller width of the contact bar 7 and dimples. In general, the use of transmission line tapers can be found in prior art for connection to high frequency devices as described above.

The measured insertion loss of the switch in FIG. 1 is typically 0.25 dB or less up to 40 GHz, and the measured isolation is approximately 25 dB or better up to 40 GHz. The measured return loss is typically 15 dB or better up to 40 GHz. In many applications, especially when the switch is used near a receive antenna, the desired return loss is specified to be greater than 20 dB in order to prevent back-reflections from coupling over to nearby elements, particularly in antenna arrays. The current switch of FIG. 1 does not meet this specification at millimeter wave frequencies. This disclosure teaches how to design a switch with integrated impedance matching structures that can provide better than 20 dB return loss at 40 GHz and still maintain better than 20 dB isolation.

The contacting bar 7 of the switch behaves as a small series inductor. For example, a microstrip line that is 26 μm wide and 100 μm long, which are the dimensions of the contacting bar of many of HRL Laboratories' RF MEMS switches, has an equivalent circuit inductance of 34 picohenries. This was calculated using Eagleware Genysis™ microwave circuit design software, where the microstrip line was assumed to be on a GaAs substrate 100 μm thick.

As is disclosed herein, from a circuit perspective, this inductance of the contacting bar 7 can be matched out by utilizing small shunt capacitances, each 6.8 fF forming a π-network with the switch contacting bar 7. An equivalent circuit is shown in FIG. 2 along with the calculated return loss (again using Eagleware Genysis™) is shown in FIG. 3. Of course, the resulting switch itself is more complicated than this simple circuit model, but this field simulation software was utilized to verify that an impedance matching structure might well be integrated into the design of a MEMS switch.

BRIEF DESCRIPTION

In one aspect, the presently disclosed technology provides an impedance matching structure for a RF MEMS switch having at least one closeable RF contact in a RF line, the impedance matching structure comprising a protuberance in the RF line immediately adjacent the RF contact.

In another aspect, the presently disclosed technology provides an impedance matching structure for a RF MEMS switch formed on a substrate, the switch having two closeable RF contacts, a first of the two closeable RF contacts being coupled to a first RF line disposed on the substrate and a second one of the two closeable RF contacts being coupled to a second RF line disposed on the substrate, and an elongate moveable bar for closing a circuit between the two closeable RF contacts, the impedance matching structure comprising a first protuberance disposed on the substrate in the first RF line immediately adjacent the first one of the two closeable RF contacts and a second protuberance disposed on the substrate in the second RF line immediately adjacent the second one of the two closeable RF contacts.

In yet another aspect, the presently disclosed technology provides a method of increasing the return loss of a MEMS switch to a level greater than 20 dB. The method includes selecting a MEMS switch arranged on a substrate and whose reactance is inductive; and then adding small capacitors on the substrate, each capacitor having two elements, a first element of each capacitor being formed by a protuberance or hump formed in RF lines disposed on the substrate and coupled to RF contacts associated with the MEMS switch, the protuberance or hump in each RF line being arranged immediately adjacent an associated RF contact and a second element of each capacitor being provided by a ground plane associated with the MEMS switch.

BRIEF DESCRIPTION OF THE DRAWINGS

(FIG. 7*b* is a more detailed view of the impedance matching structure of the switch having dimensions stated thereon in μm);

DETAILED DESCRIPTION OF THE PREFERRED EMBODIMENTS

Figure 1:
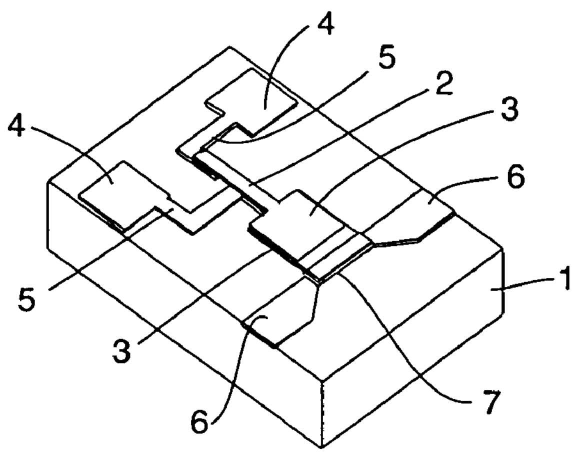
prior art Figure 1
FIG. 1 depicts a prior art RF MEMS switch designed by HRL Laboratories.
Figure 2:
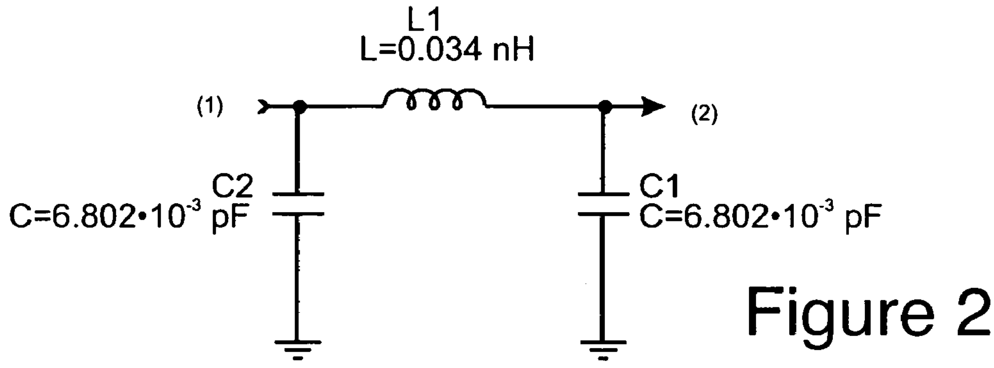
FIG. 2 is an approximate equivalent circuit of the switch-contacting bar of FIG. 1.
Figure 4:
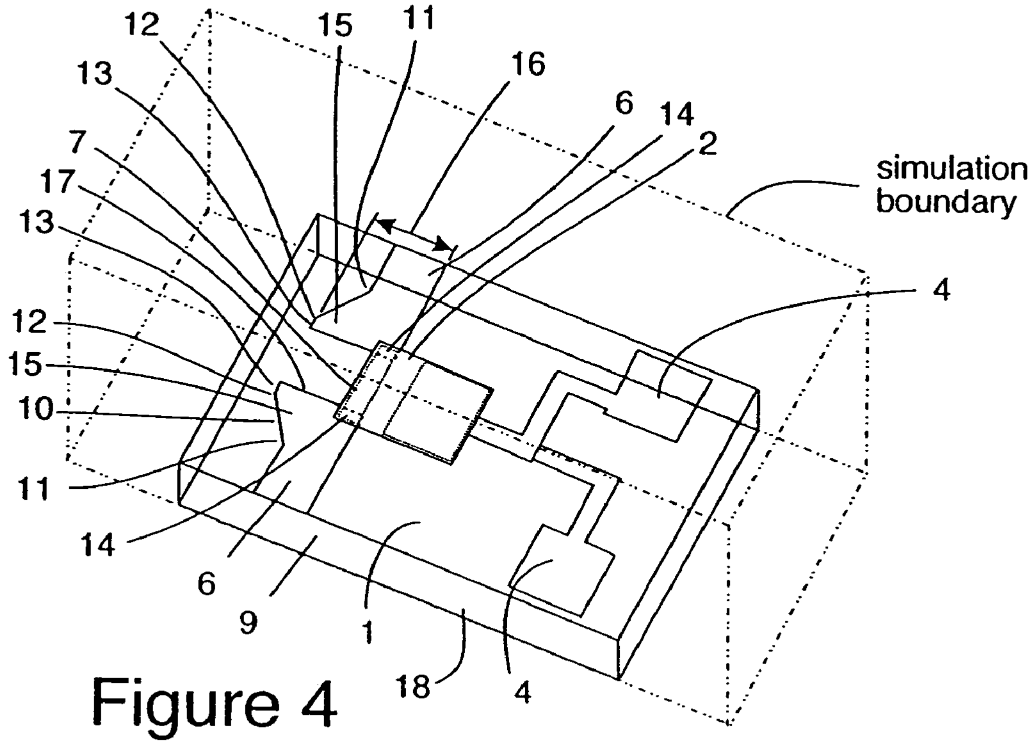
FIG. 4 depicts an embodiment of the impedance matching structure for a RF MEMS switch in accordance with the presently disclosed technology.

An embodiment of an impedance matching switch is shown in FIG. 4. This switch represents an improvement over the switch shown in FIG. 1. Nevertheless, common reference numbers are used to refer to common elements for ease of explanation and understanding.

FIG. 4 shows a configuration of the impedance-matched switch that was used for simulation of the switch using Ansoft HFSS™ field software. The switch substrate chip 1 was assumed to be 100 micron thick GaAs that is 400 μm wide by 700 μm long. The dimensions of the actuation electrodes, pads, and cantilevers are identical to that of FIG. 1, and in fact, these dimensions represent one of the current practice switches fabricated at HRL Laboratories of Malibu, Calif.

The RF transmission lines are preferably 70 μm wide at the edges 9 of the chip, to provide a 50 Ω characteristic impedance, which is preferred for many applications, on the 100 micron thick GaAs substrate 1. The impedance matched switch includes protuberances 15, which are each defined, in this embodiment, by a tapered section or portion 10 in the RF lines 6 which begins, at numeral 11, 82 μm from the edges 9 of the chip (of course, other starting points could be used for the beginning point of the taper) and which varies preferably linearly in width to a point 12 that is preferably directly lateral of the start of the dimple contacts 14 associated with the cross bar 7. The protuberances 15, in this embodiment, include a straight section 13 that is preferably equal in length, in this embodiment, to the length of the dimple contacts 14 and which extends parallel to the edge of the RF lines 6 immediately adjacent dimple contacts 14. The boundaries of each protuberance 15 is then preferably completed by another preferably straight line section 17 which mates the straight section 13 with the associated RF line 6 next to the associated dimple contract 14.

Figure 7A:
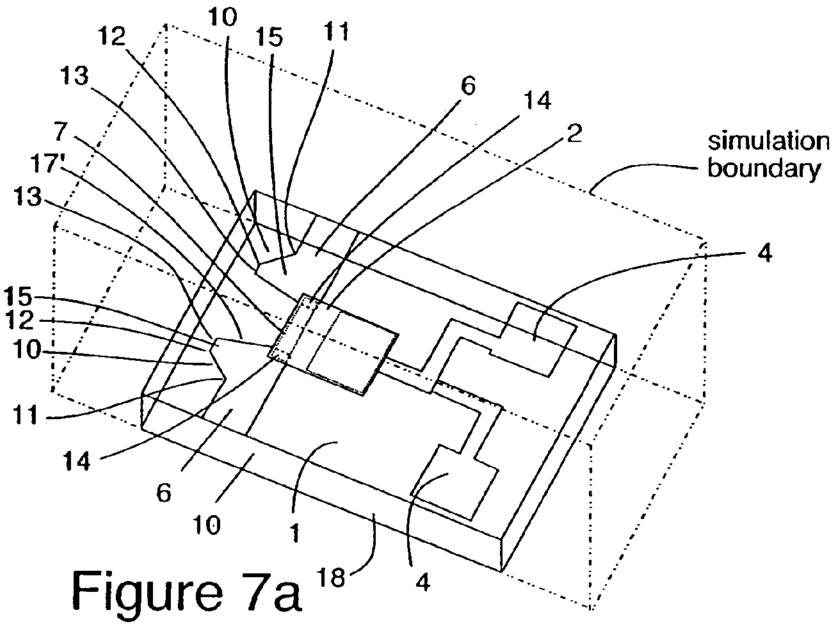
FIGS. 7*a* and 7*b* depict another embodiment of the impedance matching structure for a RF MEMS switch that was modeled on HFSS software for optimum insertion loss and with better isolation performance than the embodiment of FIG. 4

The contact resistance of the dimples 14 was simulated by assuming the resistivity of the dimple metal 14 to be 0.5 Ω resistance per dimple 14. The dimples can be disposed on the cross bar 7 and/or on the RF lines 6 as shown in FIG. 7*c*, but preferably on the cross 7 as shown by the solid line rendition in FIG. 7*c*. A ground plane 18 is preferably provided on the bottom side of the substrate 1.

The tapered section, which begins at numeral 11 and extends outwardly to point 12, helps define a protuberance or "hump" 15 at the end of each of the RF lines 6 immediately adjacent the dimple metal contacts 14 that make contact with the RF lines 6 of the switch when the switch is closed.

Figure 5:
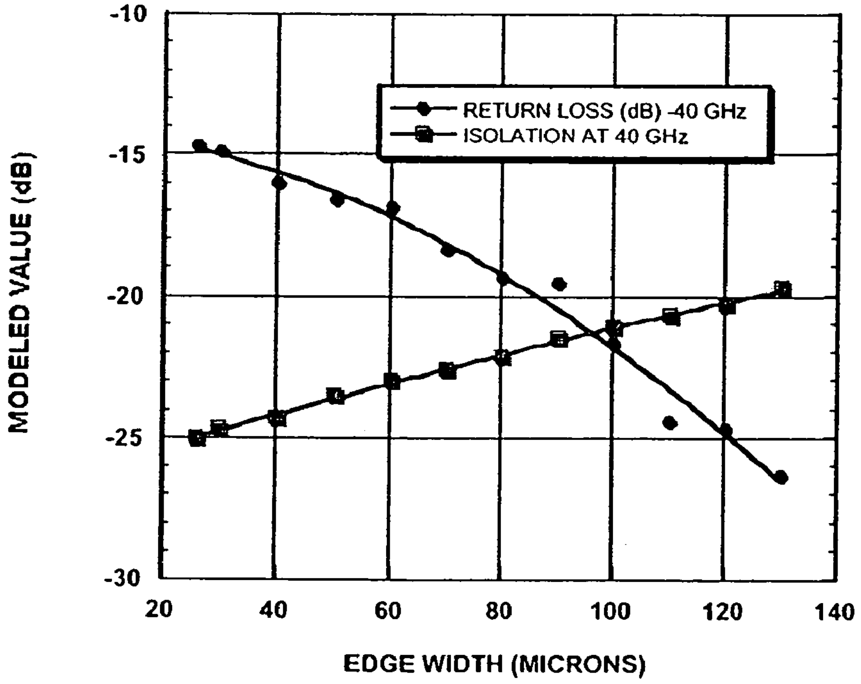
FIG. 5 is a graph of the calculated return loss and isolation at 40 GHz as a function of tapered section end width.
Figure 6:
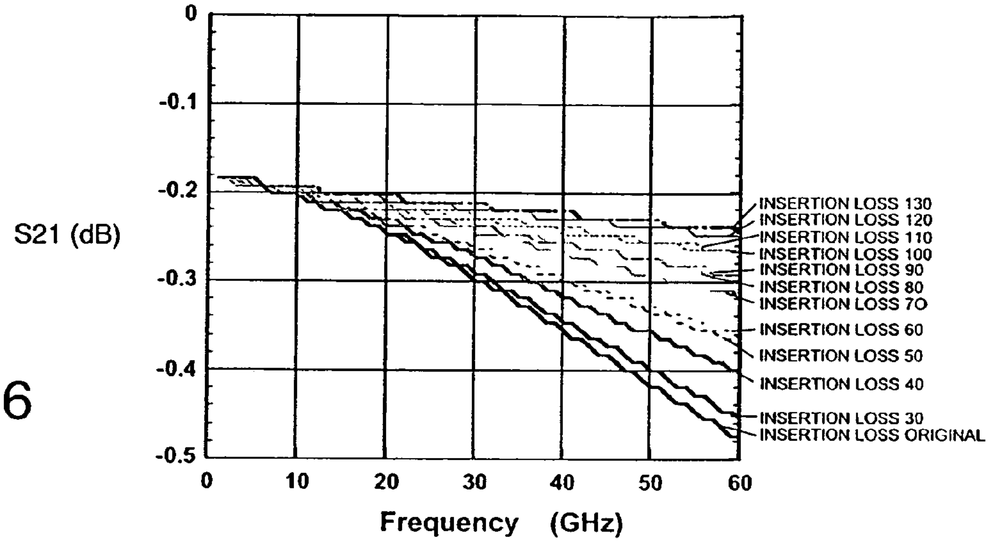
FIG. 6 is a graph of the calculated insertion loss of the linear taper section impedance matched switch as a function of frequency with the taper section end width as a varied parameter.

Simulation of the insertion loss, return loss, and isolation was performed with the taper end width or hump width 16 varying from 26 μm to 130 μm. The results of this simulation are shown in FIGS. 5 and 6. FIG. 5 is a plot of return loss and isolation at 40 GHz. From that figure, it can be seen that the return loss of the switch is greater than 20 dB for a taper end width of greater than 90 μm. The isolation, which was calculated from the model with the switch open such that the dimple contacts were 2 μm above the RF line, degrades about 3 dB at an end width of 90 μm compared to an end width of 26 μm for this embodiment. FIG. 6 shows the insertion loss as a function of frequency with the taper end width as a parameter. Improvement in the return loss also improves the insertion loss, especially at higher frequencies.

The reduction in isolation occurs from the increased fringing field due to the widened RF line 6 protuberance or hump 15 at the dimple contact 14 region. The isolation of the switch can be improved, while still maintaining excellent impedance matching, with the embodiment shown in FIGS. 7*a* and 7*b*. In this embodiment, the boundaries of the impedance matching structures 15 include two portions of increased line width (leading to predominantly shunt capacitive matching sections), forming protuberances or humps 15 on the input and output transmission lines.

Figure 3:
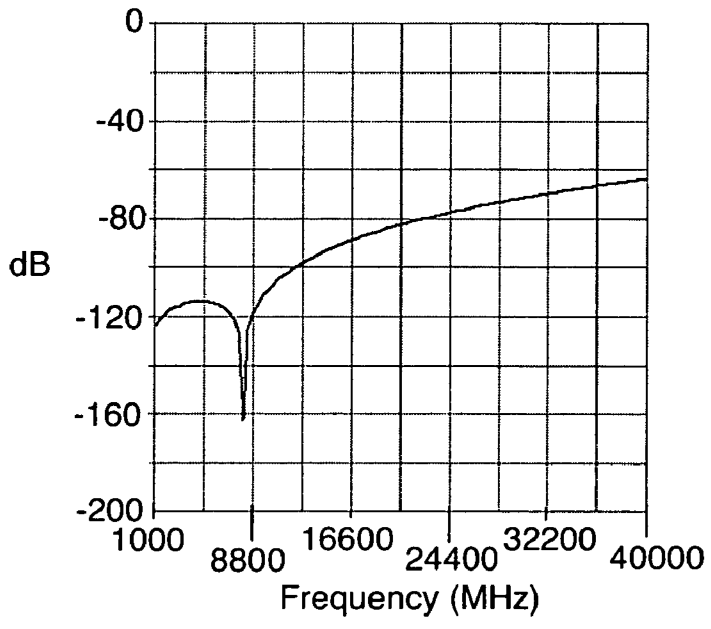
FIG. 3 is a graph of the calculated return loss up to 40 GHz of the switch of FIG. 1.

Compared to the embodiment of FIG. 4, the boundary of each protuberance or hump 15 in this embodiment has two tapered sections: a first tapered section begins at point 11 as in the case of the first embodiment, but after the protuberance or hump 15 has reached its maximal width, it decreases in width along a second tapered portion 17'. In FIG. 3 section 13 had a constant width, while in the present embodiment, section 17' has a decreasing width towards contacts 14.

Figure 7B:
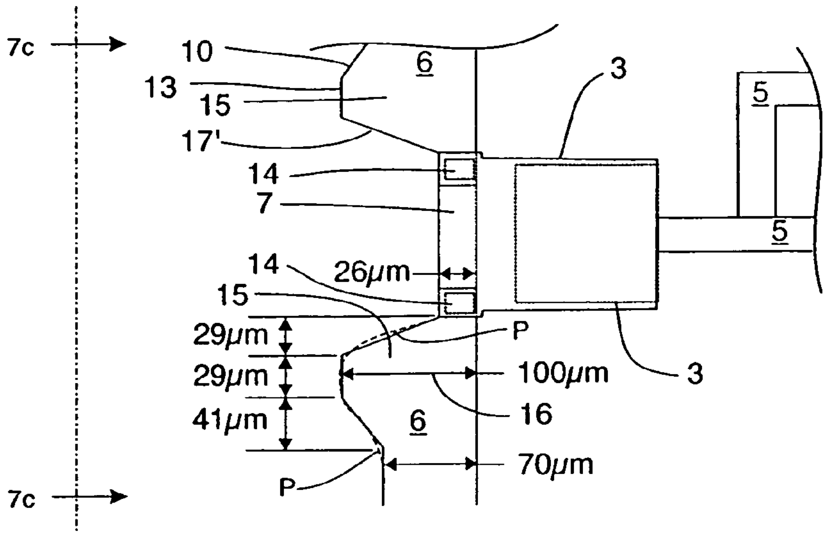
Figure 7C:
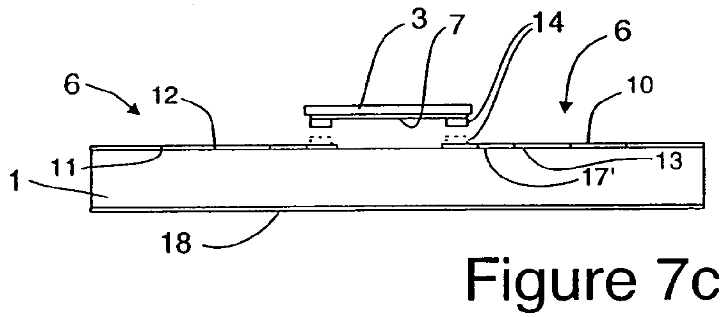
FIG. 7*c* is an elevation view of the embodiment of FIGS. 7*a* and 7*b* showing the cross bar and dimples in greater detail.
Figure 8:
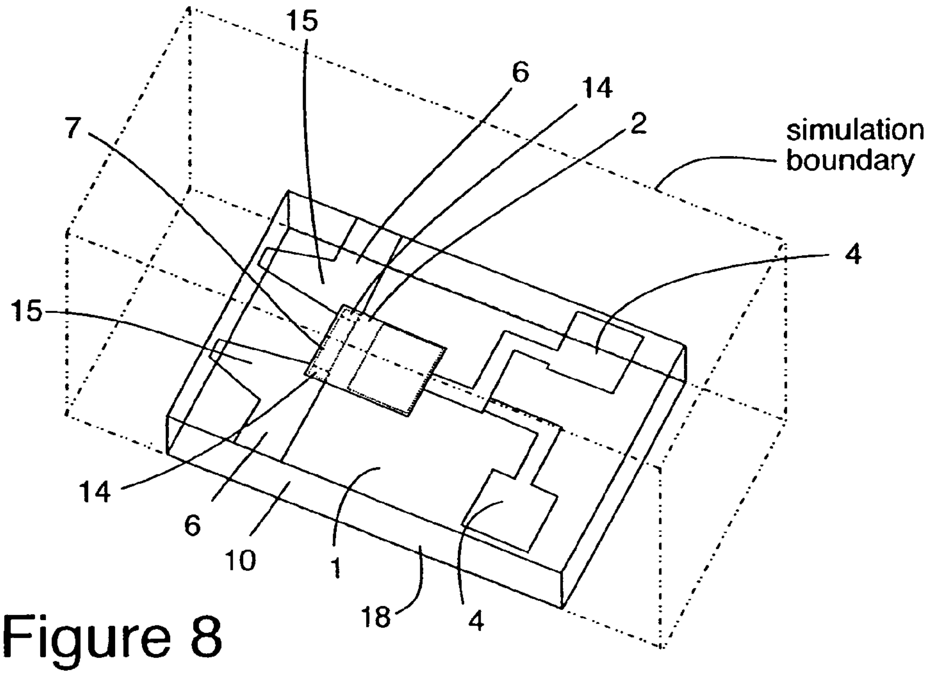
FIG. 8 depicts another embodiment of the impedance matching structure for a RF MEMS switch structure, this embodiment having wide RF transmission line protuberances or "humps" (the width being 216 μm in this figure)
Figure 9:
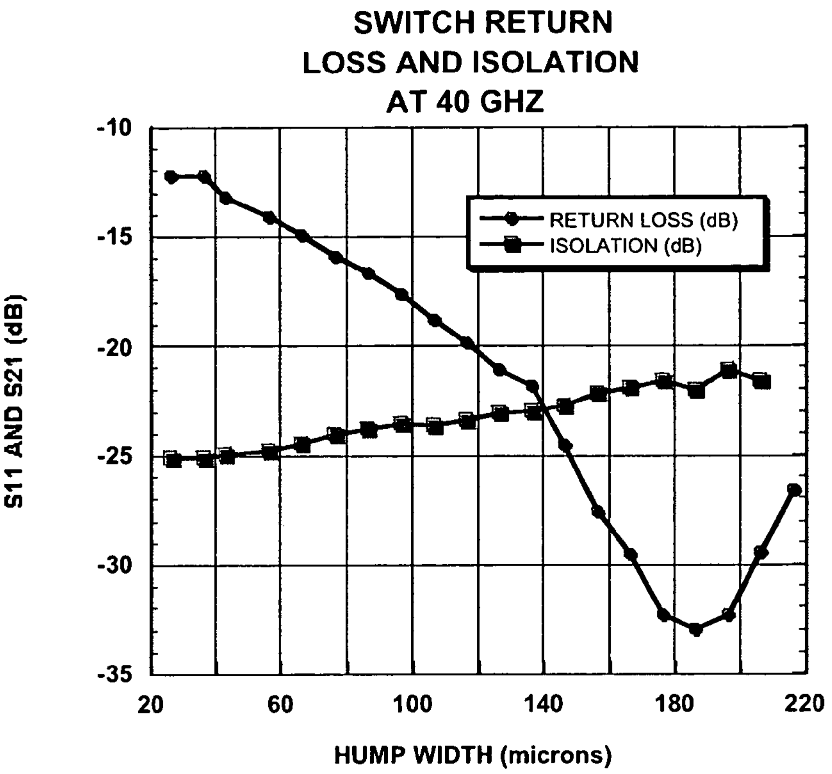
FIG. 9 is a graph of the calculated return loss and isolation at 40 GHz as a function of RF line hump widths for the embodiment of FIG. 8.

FIG. 7*b* shows this embodiment in greater detail. The RF lines 6 are preferably 70 μm wide and the hump width increases to a 100 μm width at the humps 15. FIG. 8 shows an embodiment with RF lines 6 having even larger protuberances 15—in this embodiment the RF lines have a maximal hump width of 216 μm at the protuberances 15 (compared to the 100 μm width for the embodiment of FIGS. 7*a* and 7*b*). The dimple contact 14 width is still 26 μm for these embodiments and a linear line taper leads from the widest portion of the protuberance 15 back to the region where the dimple contact 14 is located. Field simulations show that for the embodiments of FIGS. 7*a*/7*b* and 8, the optimum impedance match at 40 GHz occurs when the hump 15 is 186 μm wide (which is then 186/70 or slightly more than 2.5 times the width of the RF line 6). This is graphed in FIG. 9, which also shows the calculated isolation values, for different protuberance or hump widths 16. In that graph it can be seen that a 35 dB return loss can be achieved with 22 dB isolation, compared to 26 dB return loss and 20 dB isolation for the embodiment of FIG. 4 (the simulations of the embodiment of FIG. 4 set forth in FIG. 5 were not run out to the optimum return loss, but the trend in the calculated isolation values would only get worse at the optimum return loss).

FIG. 7*c* shows this embodiment as an elevation view taken along line 7*c* shown in FIG. 7*b*.

As such, the embodiments of FIGS. 7*a*, 7*b* and 8, where the boundaries of the protuberances 15 each include two tapered straight line sections, appear to be superior to the embodiment of FIG. 4. It is believed that additional straight line sections in the boundaries of the protuberances 15 would also provide very satisfactory results as would the use of a curved protuberance such as the curved line boundary P in FIG. 7*b* which approximates the straight line boundary defined by edges 10, 13 and 17.

Figure 10:
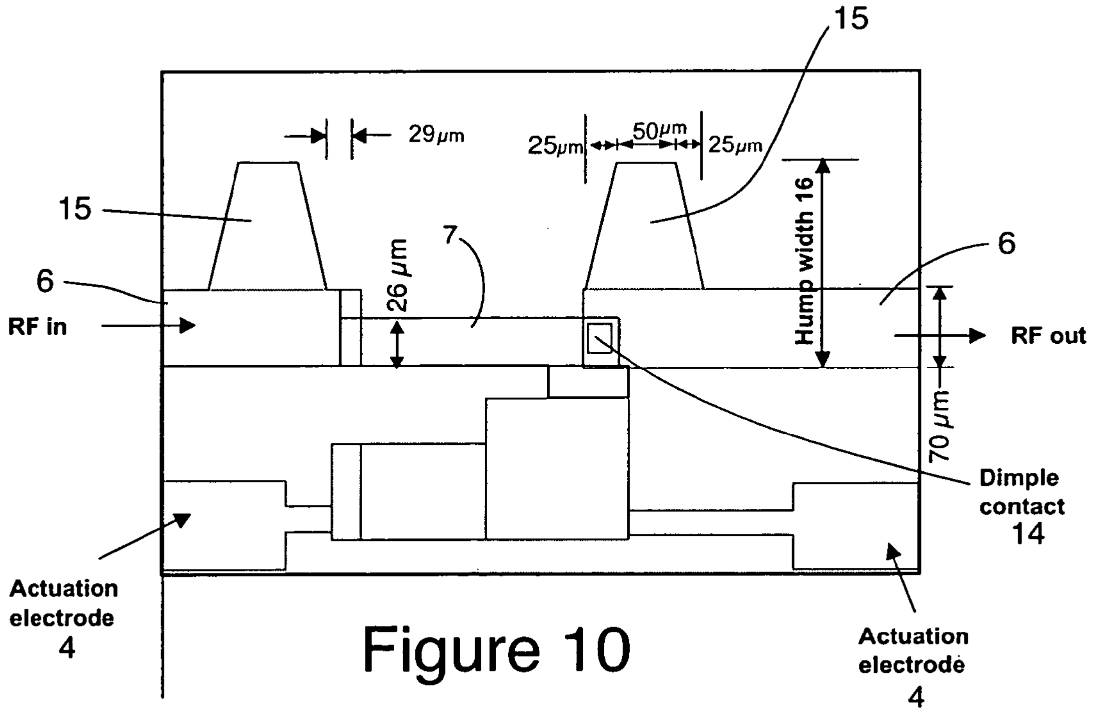
FIG. 10 is a top view of a single-contact RF MEMS switch geometry with impedance matching humps (dimensions are indicated in μm)
Figure 11:
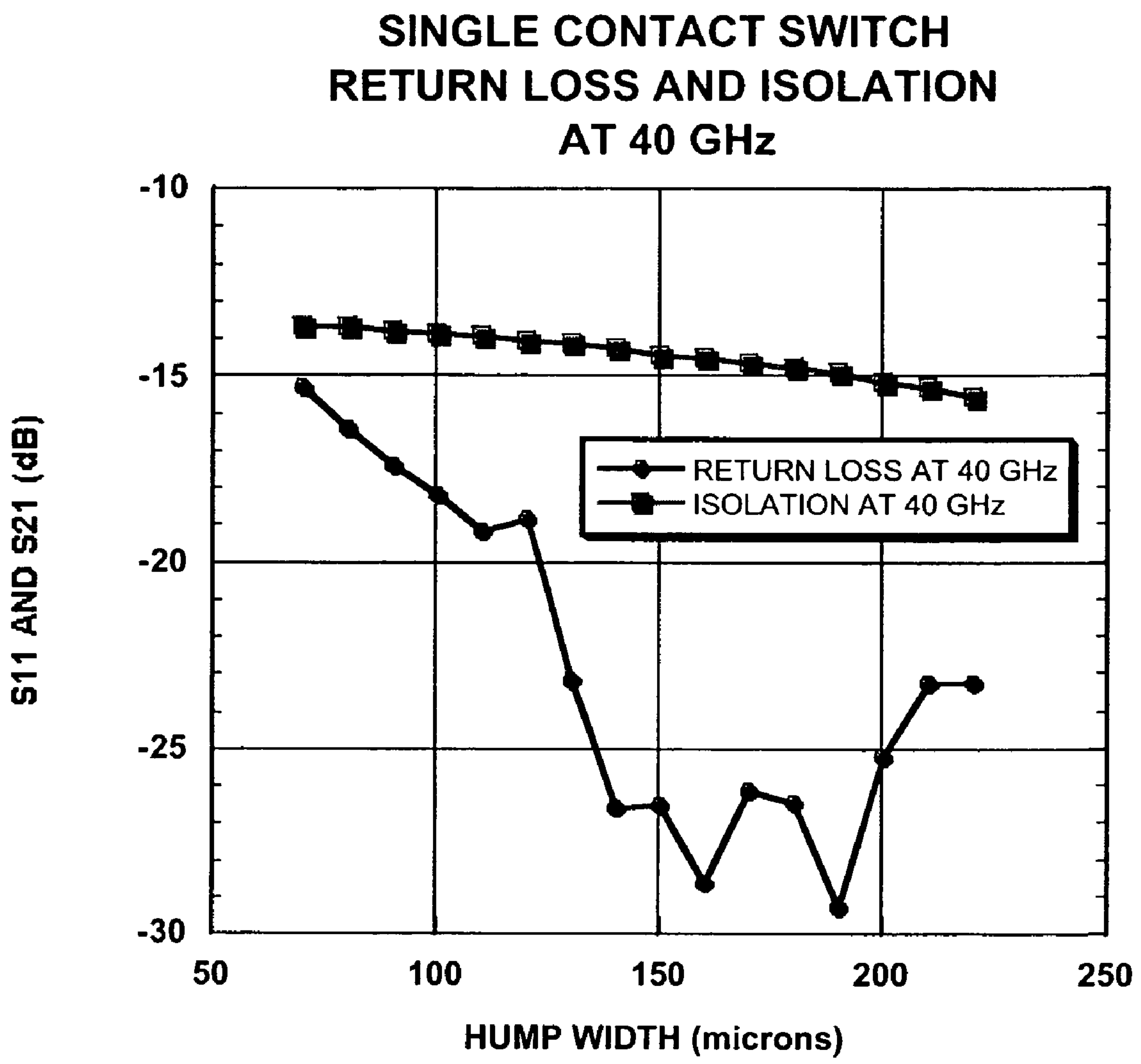
FIG. 11 is a graph of the calculated return loss and isolation at 40 GHz of the single-contact RF MEMS switch shown in FIG. 10 as a function of matching circuit hump width.

A similar impedance matching protuberance or hump 15 for an embodiment of a single contact switch is shown in FIG. 10. FIG. 11 shows the plot of simulated return loss and calculated isolation values versus hump 15 width for the embodiment of FIG. 10. The widths of the RF lines 6 are preferably 70 μm while the width of the cross bar 7 is preferably 26 μm. From FIG. 11 it can be seen that the return loss is better than 25 dB over a hump width range from 140 to 200 μm, thus the return loss optimization is less sensitive to the impedance matching network than the double contact switch embodiments of FIGS. 4 and 7*a*/7*b*. Also, the isolation changes by about 1 dB (it actually improves) as the protuberance or hump 15 width 16 is varied.

In the foregoing embodiments, the impedance matching protuberances or humps 15 are shown typically with one (see element 10) and preferably two (see elements 10 and 17') straight line tapered sections that are disposed at neither 0° nor 90° to the immediate straight line edges of the RF lines 6. These tapered sections 10, 17' effectively increase the width of the RF lines 6 in the immediate vicinity of the switch bar 7 contacts 14. The tapered sections 10, 17' need not necessarily be defined by straight lines. For example, it is believed that rounded humps or protuberances 15 (see line P in FIG. 7*b*) or humps or protuberances formed by a series of shorter straight line sections will also prove quite satisfactory.

Having described this technology in connection with certain preferred embodiments, modification will now doubtlessly suggest itself to those skilled in the art. As such, the presently disclosed technology is not to be limited to the disclosed embodiments except as required by the appended claims.

What is claimed is:

1. An impedance matching structure for a RF MEMS switch having a closeable RF contact in a RF line, the impedance matching structure including only one protuberance or hump to increase the width of a portion of the RF line immediately adjacent the RF contact to greater than the width of a portion of the RF line removed from the RF contact, wherein the width of the RF contact where the RF contact meets the RF line is less than the width of the portion of the RF line removed from the RF contact.

2. The impedance matching structure of claim 1 wherein the only one protuberance or hump includes a tapered region extending from a relatively narrow portion of the RF line to a relatively wide portion of the RF line, the relatively narrow portion providing a means for conducting RF energy to and/or from the RF contact of the RF MEMS switch.

3. The impedance matching structure of claim 2 further including another tapered region extending from the relatively wide portion of the RF line to a relatively narrow portion of the RF line immediately adjacent the RF contact.

4. The impedance matching structure of claim 2 wherein the relatively wide portion of the RF line is at least twice as wide as the relatively narrow portion of the RF line.

5. The impedance matching structure of claim 2 wherein the relatively wide portion of the RF line is at least five times as wide as the width of the RF contact where the RF contact meets the RF line.

6. The impedance matching structure of claim 2 wherein the MEMS switch has an elongate moveable member for carrying RF energy, the relatively wide portion of the RF line being at least five times as wide as the width of the elongate moveable member.

7. The impedance matching structure of claim 1 wherein the RF MEMS switch is formed on a substrate and wherein the closeable contact is associated with an elongate moveable member having first and second ends, the first end being attached to the substrate and the second end being moveable to and from the substrate for closing the switch at said closeable contact and wherein the impedance matching structure further includes a single protuberance in the RF line immediately adjacent a point where the first end of the elongate moveable member is attached to said substrate.

8. The impedance matching structure of claim 1 wherein the impedance matching structure has a boundary extending away from the RF line, the boundary being defined by a series of straight lines.

9. A RF MEMS switch having two RF contacts disposed on a substrate, the substrate having a ground plane, and a RF conductor for coupling RF energy via the two RF contacts and wherein each of the two RF contacts has an associated single protuberance or hump to increase the width of a portion of the RF conductor immediately adjacent thereto to greater than the width of a portion of the RF conductor removed from the RF contacts, wherein the width of the RF contacts where the RF contacts meet the RF conductor is less than the width of the portion of the RF conductor removed from the RF contacts.

10. The RF MEMS switch of claim 9 wherein the single protuberances or humps in the RF conductor are disposed on the substrate and cooperate with said ground plane to form a capacitive element for impedance matching purposes.

11. The RF MEMS switch of claim 10 wherein at least a portion of the RF conductor is disposed on the substrate as RF lines and wherein another portion of the RF conductor is provided by a moveable member of the MEMS switch, each RF line being coupled to an associated one of the RF contacts and the single protuberance or hump associated with each RF contact occurring in an associated RF line where it connects the associated one of the RF contacts.

12. An impedance matching structure for a RF MEMS switch formed on a substrate, the switch having two closeable RF contacts, a first of the two closeable RF contacts being coupled to a first RF line disposed on the substrate and a second one of the two closeable RF contacts being coupled to a second RF line disposed on the substrate, and an elongate moveable bar for closing a circuit between the two closeable RF contacts, the impedance matching structure comprising a single first protuberance disposed on the substrate to increase the width of a portion of the first RF line immediately adjacent the first one of the two closeable RF contacts to greater than the width of a portion of the first RF line removed from the first one of the two closeable RF contacts and a single second protuberance disposed on the substrate to increase the width of a portion of the second RF line immediately adjacent the second one of the two closeable RF contacts to greater than the width of a portion of the second RF line removed from the second one of the two closeable RF contacts, wherein the width of the first of the two closeable RF contacts where the first of the two closeable RF contacts meets the first RF line is less than the width of the portion of the first RF line removed from the first of the two closeable RF contacts and wherein the width of the second one of the two closeable RF contacts where the second one of the two closeable RF contacts meets the second RF line is less than the width of the portion of the second RF line removed from the second one of the two closeable RF contacts.

13. The impedance matching structure of claim 12 including tapered regions extending from a relatively narrow portion of the first and second RF lines to relatively wide portions of the corresponding first and second protuberances.

14. The impedance matching structure of claim 13 further including additional tapered regions extending from the relatively wide portions of the first and second RF lines to relatively narrow portions immediately adjacent the corresponding first and second RF contacts.

15. The impedance matching structure of claim 13 wherein the relatively wide portions of each of the first and second protuberances are at least twice as wide as the relatively narrow portions of the corresponding first and second RF lines.

16. The impedance matching structure of claim 13 wherein the relatively wide portions of each of the first and second protuberances are at least five times as wide as the width of the corresponding first and second RF contacts where the RF contacts meet the corresponding first and second RF lines.

17. The impedance matching structure of claim 13 wherein the relatively wide portions of each of the first and second protuberances are at least five times as wide as the width of the elongate moveable bar.

18. The impedance matching structure of claim 13 wherein the first protuberance has a boundary extending away from the first RF line and the second protuberance has a boundary extending away from the second RF line, the boundaries of the first and second protuberances each being defined by a series of straight lines.

19. A method of increasing the return loss of a MEMS switch to a level greater than 20 dB comprising:

a. providing a MEMS switch arranged on a substrate and whose reactance is inductive; and b. adding at least one capacitor on said substrate, said at least one capacitor having two elements, a first element of said at least one capacitor being formed by a single protuberance formed to increase the width of a portion of a RF line disposed on said substrate immediately adjacent to a RF switch contact on the substrate to greater than the width of a portion of the RF line removed from the RF switch contact, and a second element of said at least one capacitor being provided by a ground plane associated with the MEMS switch, wherein the width of the RF switch contact where the RF switch contact meets the RF line is less than the width of the portion of the RF line removed from the RF switch contact.

20. The method of claim 19 wherein said single protuberance projects in a direction away from its associated RF contact.

21. The method of claim 19 wherein said single protuberance has a boundary defined by a plurality of straight lines, at least one of said straight lines being disposed at an angle other than 0° or 90° relative to an edge of the RF line immediately adjacent the single protuberance.

22. An impedance matching structure for a MEMS switch having at least one closeable switch contacting bar, the switch contacting bar when actuated, closing the MEMS switch by making contact with contact pads disposed on a switch substrate, the impedance matching structure including a pair of contact pads, each pad coupled to a signal line having a single protuberance or hump to increase the width of a portion of the signal line adjacent the pad to greater than the width of a portion of the signal line removed from the pad, protuberances or humps forming a π-network impedance matching circuit with the switch contacting bar.

23. The impedance matching structure of claim 22 wherein each protuberance or hump includes a tapered region extending from a relatively narrow portion of an associated signal line to a relatively wide portion of the associated signal line, the relatively narrow portion providing a means for conducting signals to and/or from the MEMS switch.

24. The impedance matching structure of claim 23 further including another tapered region extending from the relatively wide portion of the associated signal line to a relatively narrow portion of the associated signal line immediately adjacent an associated contact pad.

* * * * *